United States Patent [19]
Beratan et al.

[11] Patent Number: 5,656,848
[45] Date of Patent: *Aug. 12, 1997

[54] HIGH THERMAL RESISTANCE BACKFILL MATERIAL FOR HYBRID UFPA'S

[75] Inventors: Howard R. Beratan; Chih-Chen Cho, both of Richardson, Tex.

[73] Assignee: Texas Instruments Incorporated, Dallas, Tex.

[*] Notice: The term of this patent shall not extend beyond the expiration date of Pat. No. 5,536,965.

[21] Appl. No.: 477,004

[22] Filed: Jun. 7, 1995

Related U.S. Application Data

[62] Division of Ser. No. 412,817, Mar. 29, 1995.

[51] Int. Cl.$^6$ .................. H01L 31/058; H01L 31/101; H01L 31/09
[52] U.S. Cl. .................. 257/446; 257/444; 257/467; 257/632
[58] Field of Search .................. 257/444, 632, 257/446, 467

[56] References Cited

U.S. PATENT DOCUMENTS

| | | | |
|---|---|---|---|
| 4,080,532 | 3/1978 | Hopper | 250/332 |
| 4,745,278 | 5/1988 | Hanson | 250/338.2 |
| 4,792,681 | 12/1988 | Hanson | 250/338.2 |
| 5,235,195 | 8/1993 | Tran et al. | 257/444 |
| 5,300,807 | 4/1994 | Aklson | 257/632 |
| 5,448,015 | 9/1995 | Havemann et al. | 437/195 |
| 5,461,003 | 10/1995 | Havemann et al. | 437/187 |
| 5,470,802 | 11/1995 | Gnade et al. | 437/195 |
| 5,472,913 | 12/1995 | Havemann et al. | 437/195 |
| 5,476,817 | 12/1995 | Numata | 437/195 |
| 5,478,242 | 12/1995 | Walker et al. | 437/3 |
| 5,494,858 | 2/1996 | Gnade et al. | 437/231 |

OTHER PUBLICATIONS

Hanson, et al., "Low-Cost Uncooled Focal Plane Array Technology", Aug. 17, 1993.

*Primary Examiner*—Jerome Jackson, Jr.
*Attorney, Agent, or Firm*—Kay Houston; James C. Kesterson; Richard L. Donaldson

[57] ABSTRACT

A porous film 64 is used to thermally insulate sensing integrated circuitry 44 from pixels 34 of an uncooled IR detector hybrid system 30. The porous film 64 is preferably a silicon-dioxide xerogel. A protective film 65 may be deposited on the porous film 64.

7 Claims, 5 Drawing Sheets

HIGH THERMAL RESISTANCE BACKFILL MATERIAL FOR HYBRID UFPA'S

This is a divisional of Ser. No. 08/412,817 application filed Mar. 29, 1995.

CROSS-REFERENCE TO RELATED APPLICATIONS

The following U.S. patent applications are commonly assigned and are hereby. incorporated herein by reference:

| TI Case | Ser. No | Filing Date | Inventor | Title |
| --- | --- | --- | --- | --- |
| TI-18788 | 08/182,865 | 1/13/94 | Belcher et al. | Infared Detector and Method |
| TI-17233 | 08/182,268 | 1/13/94 | Belcher et al. | Infrared Detector and Method |
| TI-19178 | 08/255,157 | 6/7/94 | Gnade et al. | Porous Composites as a Low Dielectric Constant Material for Electronics Applications |
| TI-18996 | 08/263,572 | 6/23/94 | Gnade et al. | Porous Dielectric Material with Improved Pore Surface Properties for Electronics Applications |
| TI-18941 | 08/247,195 | 5/20/94 | Gnade et al. | A Low Dielectric Constant Material for Electronics Applications |

The following U.S. patent application filed concurrently herewith the patent application for the present invention is also incorporated herein by reference:

| TI Case | Inventor | Ser. No. | Title |
| --- | --- | --- | --- |
| TI 19896 | Beratan et al. | 08/412,662 | Porous Thermal Isolation Mesas for Hybrid Uncooled Infrared Detectors |

FIELD OF THE INVENTION

This invention generally relates to infrared or thermal imaging systems, and more specifically to thermal isolation in a thermal (infrared) detector array, or hybrid uncooled focal plane array (UFPA).

BACKGROUND OF THE INVENTION

Infrared or thermal imaging systems typically use thermal sensors to detect infrared radiation and produce an image capable of being visualized by the human eye. Some examples of such thermal imaging devices include night vision equipment and law enforcement surveillance equipment.

Several prior art references disclose infrared imaging arrays and methods for producing such arrays. U.S. Pat. Nos. 4,080,532 issued to Hopper; and 4,745,278 and 4,792,681 issued to Hanson utilize ferroelectric materials for infrared detection. Thermal imaging by means of uncooled sensors is described in a paper entitled *Low-cost Uncooled Focal Plane Array Technology* written by Hanson, Beratan, Owen and Sweetser presented Aug. 17, 1993 at the IRIS Detector Specialty Review.

SUMMARY OF THE INVENTION

The present invention is a method for fabricating a hybrid thermal detector structure, comprising the steps of providing integrated circuitry, depositing a precursor film on the integrated circuitry, gelling the precursor film to form a thermally insulating porous film, patterning the porous film to form vias, filling the vias with metal and forming interconnect metal on the porous film, where the interconnect metal is electrically connected to the integrated circuitry. Then an infrared sensing array comprising at least three thermally sensitive pixels, electrical contacts defining pixel capacitors and abutting a first side of the pixels, and an optical coating in contact with a second side of the pixels is provided, and the interconnect metal is coupled to the electrical contacts of the infrared sensing array. A protective film may be deposited on the porous film, and exposed portions of the porous film may be removed.

The present invention also entails a hybrid thermal detector structure, comprising an infrared sensing array comprising at least three thermally sensitive pixels, electrical contacts abutting one side of the pixels, and an optical coating in contact with an opposite side of the pixels; and a sensing integrated circuit structure comprised of integrated circuitry, a porous film mounted on the integrated circuitry, and interconnect metal electrically connecting the integrated circuitry to contact pads on the porous film; wherein the electrical contacts of the infrared sensing array are coupled to the contact pads of the sensing integrated circuit structure. A protective film may be deposited on the porous film.

Advantages of the invention include simplification of the lithography process for forming the interconnect metal that provides electrical connection between the pixels and the integrated circuitry. Lower temperatures are required to process the porous film, which prevents or minimizes damage to the underlying integrated circuitry. Thermal isolation between the pixels and the integrated circuitry is improved because silica aerogels and xerogels are better thermal insulators than organic materials used in the past. The improved thermal isolation maintains the thermal time constant as detector mass is reduced, and may permit the use of thinner pixels in the future. The optional protective film provides improved mechanical support and prevents subsequently deposited metal from penetrating the pores of the porous film. The protective film also seals the porous film surface, minimizing outgassing in low pressure applications.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

Figure 1:
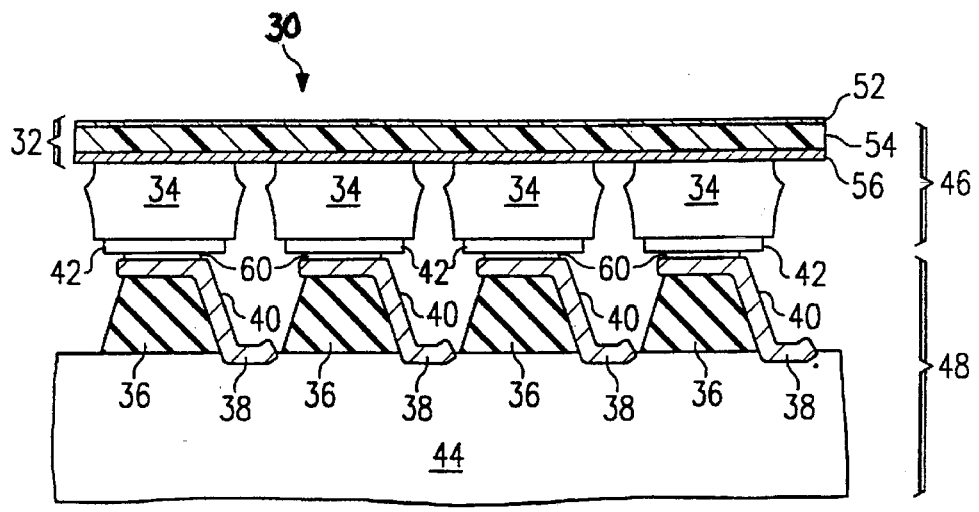
FIG. 1 illustrates the generic concept of a hybrid structure of the prior art consisting of a planar infrared sensing array electrically and physically bonded to thermally isolating mesas on a sensing integrated circuit.

The drawings are neither to absolute nor relative scale. Thin film thicknesses have been exaggerated for clarity in description.

DETAILED DESCRIPTION OF THE PREFERRED EMBODIMENTS

Thermal imaging systems described in prior art references utilize an array of ferroelectric or bolometric sensors to detect thermal scenes which may then be converted into a visual, for example, TV, image. Each pixel (or resistor, when bolometric sensors are used) in these arrays comprises a pyroelectric capacitor having a temperature-sensitive polarization. Since the charge stored by a capacitor is a function of its terminal voltage and capacitance, electronic circuitry may be attached to the two terminals of the pixel capacitor to measure the intensity of infrared radiation impinging on a specific pixel. Obstructions in the imaging field are removed and electronic connections to these capacitors are simplified if one of these pixel terminals is common to all. From hundreds to hundreds of thousands of connections are made between the other isolated terminals of the capacitors and the integrated circuit used for electronic sensing. In addition, the pixels are thermally isolated from each other while having one terminal electrically connected to all the other common terminals.

The common connection, or common electrode, to one side of the pixel capacitors may be part of an optical coating comprised of a plurality of thin films having the desired physical properties, such as infrared transparency, electrical conductivity, and thermal conductivity, for example. The infrared energy is absorbed by the optical coating and is transferred to the pixels which may be made, for example, of barium strontium titanate (BST). The electrical polarization and capacitance of a pyroelectric material such as BST changes in response to temperature.

Typically, an infrared absorber and common electrode assembly are disposed on one side of the pyroelectric element and comprise an optical coating disposed over a common electrode. A signal sensor electrode may be disposed on the opposite side of each pyroelectric element. The infrared absorber and common electrode assembly typically extend across the surface of the focal plane array and electrically couple each pyroelectric element through the common electrode. Each infrared detector element or thermal sensor is defined, in part, by a portion of the infrared absorber and a common electrode assembly and a respective sensor signal electrode, which constitute capacitive plates, and a pyroelectric element, which constitutes a dielectric or insulator disposed between the capacitive plates.

To maximize thermal response and enhance thermal image accuracy, each pyroelectric element of a focal plane array is preferably isolated thermally from adjoining pyroelectric elements so that the sensor signal accurately represents incident infrared radiation associated with each thermal sensor. When the uncooled IR hybrid structure is in use, the temperature of the pixel is modulated by chopping incident IR radiation. This temperature change is sensed as a voltage by the readout IC. For optimum operating performance, it is also important to thermally isolate the pyroelectric elements from the sensing integrated circuitry.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of preferred embodiments and manufacturing methods of the present invention. Table 1 below provides an overview of the elements of the embodiments and the drawings. The present invention and its advantages are best understood by referring to FIGS. 2–10 and Table 1 with like numbers being used for like and corresponding parts in the drawings.

TABLE 1

| Drawing Element | Generic Term | Preferred or Specific Examples | Other Alternate Examples or Descriptions |
| --- | --- | --- | --- |
| 30 | Hybrid Structure | | Hybrid device; hybrid system |
| 32 | Optical coating | Multilayered | |
| 34 | Pixels | Barium strontium titanate | Thermally sensitive dielectric; pixel dielectric; pyroelectric |
| 36 | Thermal isolation mesas | Photosensitive polyimide, Dupont 2734 | PMMA (polymethyl-methacrylate) |
| 38 | Integrated circuit via for sensing circuit | | |
| 40 | Interconnect metal | Metals or alloys such as TiW or NiCr. | Conductive oxides |
| 42 | Infrared pixel electrical contact | NiCr | Metals or alloys such as TiW, Au; 4 layer composite of: In 0.5–6 μm Au 0.01–0.5 μm NiCr 0.01–0.5 μm TiW 0.01–0.5 μm |
| 44 | Integrated circuitry | Silicon technology | IR Sensing IC, Sensing integrated circuit, GaAs; readout IC |
| 46 | Infrared sensing array | Optical Coating 32, Pixels 34, Electrical contact 42 | Infrared imaging array |
| 48 | Sensing integrated circuit structure | Mesas 36, interconnect metal 40, integrated circuitry 44 | |
| 52 | Infrared transparent layer of 32. | NiCr (50 Å) | 25–100Å of Cermet (Cr—SiO); 25–5000Å of Lanthanum Strontium Cobalt Oxide (LSCO) |
| 54 | ¼ wavelength separator layer of 32 | Parylene (1.4 μm) | ¼ wavelength at desired infrared signal; polyimide |
| 56 | Electric conducting layer of 32 | NiCr (1000 Å) | 500–2000 Å; common electrode; cerment; other metals; alloys such as TiW; conductive oxides such as LSCO |
| 60 | Bonding material | Indium alloy | PbSn alloy |
| 62 | Precursor film | Silica precursor film | Organometallic silicate solution; a liquid that will gel to form a $SiO_2$ or SiC xerogel or aerogel |
| 64 | Porous film | Silicon dioxide-based xerogel | Silicon dioxide-based aerogel; silicon carbide-based aerogel or xerogel; other aerogels or xerogels; preferably >80% porosity |
| 65 | Protective film | Silicon dioxide | Silicon nitride; other dense thin films; other silicon composites |
| 66 | Holes | | Holes in porous film 64 where vias 70 will be formed |
| 68 | Metal layer | NiCr | Bilayer comprising 500 Å of TiW and 500 Å of Au; other metals, alloys or conductive oxides. |
| 70 | Vias | NiCr | Bilayer comprising 500 Å TiW and 500 Å Au; other metals, alloys or electrical conductors. |

TABLE 1-continued

| Drawing Element | Generic Term | Preferred or Specific Examples | Other Alternate Examples or Descriptions |
| --- | --- | --- | --- |
| 72 | Arms | NiCr | Bilayer comprising 500 Å of TiW and 500 Å of Au; other metals, alloys or electrical conductors. |
| 74 | Contact pads | NiCr | Bilayer comprising 500 Å of TiW and 500 Å of Au; other metals, alloys or electrical conductors. |

While many different geometries and configurations have been described in the references, FIG. 1 shows a prior art drawing of a generic hybrid structure 30 comprised of an infrared sensing array 46 electrically and physically bonded to a sensing integrated circuit structure 48. The optical coating 32 is comprised of a partially infrared transparent layer 52, a ¼ wavelength filter material 54 and an electrical conducting layer 56. The electrical and physical mounting of infrared sensing array 46 to sensing integrated circuit structure 48 is achieved by the use of a bonding material 60 to adhere the infrared electrical pixel contacts 42 with the interconnect metal 40 through the vias 38.

There are several problems with the prior art structure depicted in FIG. 1. First, the interconnect metal 40 which provides the electrical connection between the pixels 34 and the integrated circuitry 44 is difficult to pattern and etch because of the height of the mesas 36 which are typically around 12 μm tall. Second, the temperatures required to process the organic materials used in the past for the thermal isolation mesas 36 may damage the underlying integrated circuitry 44. The properties of resistors on the underlying IC are permanently and deleteriously changed at the temperature range of 350°–400° C. that is currently used for polyimide. Third, although the pixels 34 have been thermally isolated from integrated circuitry 44 by thermal isolation mesas 36 mounted to integrated circuitry 44, thermal crosstalk may still restfit via thermal conduction through the mesas 36 and interconnect metal 40. Mesas 36 of prior art were comprised of an organic material such as polyimide or PMMA which does not provide sufficient thermal insulation between the pixels 34 and the integrated circuitry 44 as pixel height is reduced.

Figure 2:
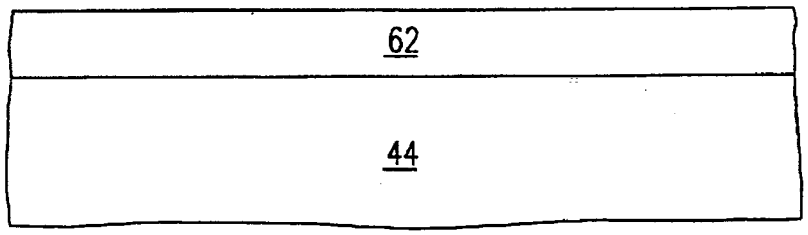
FIG. 2 shows a cross-section of a precursor film deposited on sensing integrated circuit.

A first embodiment of the present invention is shown in FIGS. 2–8. FIG. 2 shows the sensing integrated circuitry 44 upon which a precursor film 62 has been deposited. The precursor film 62 is preferably an organometallic silicate solution which may be gelled into a silicon-dioxide based xerogel. The precursor film 62 may also comprise liquids that will gel to form silicon dioxide-based aerogel, silicon carbide aerogel or xerogel, or other aerogels or xerogels. The precursor film 62 is liquid and is very planar when applied.

Figure 3:
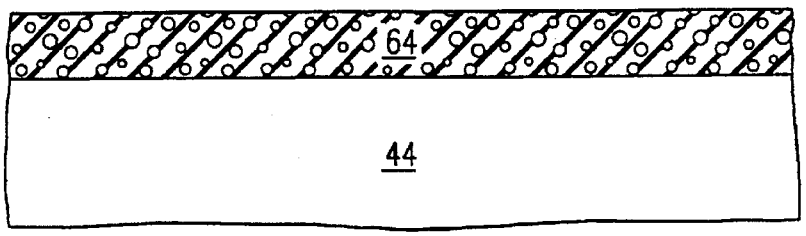
FIG. 3 shows the structure after the precursor film has been gelled to form a porous film on the integrated circuit.

The precursor film 62 is gelled to form a porous film 64 as shown in FIG. 3. The precursor film 62 may be gelled by supercritical or non-supercritical drying. Preferably, the resulting porous film 64 is greater than 80% porous. However, the porous film 64 may also be less than or equal to 80% porous, if the mechanical strength of the resulting porous film 64 is insufficient to structurally support the hybrid structure 30. The porous film 64 may be of shorter height (for example 1–6 μm, or one-tenth to half the height of an organic mesa found in prior art) than that of prior art due to the improved thermal insulative properties of the porous film 64 and geometry of metal arms 72.

Figure 4:
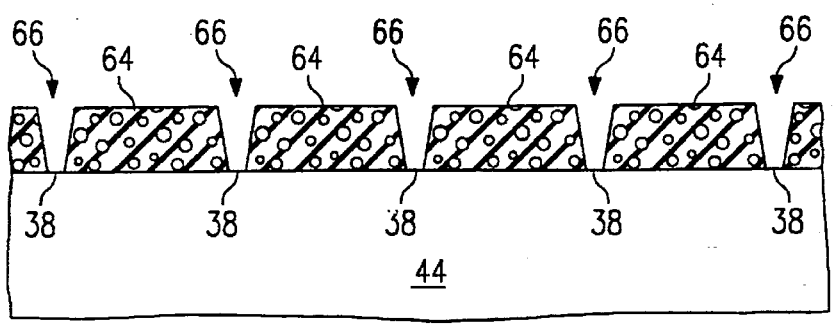
FIG. 4 illustrates the structure after the porous film has been patterned and etched to form holes.
Figure 5:
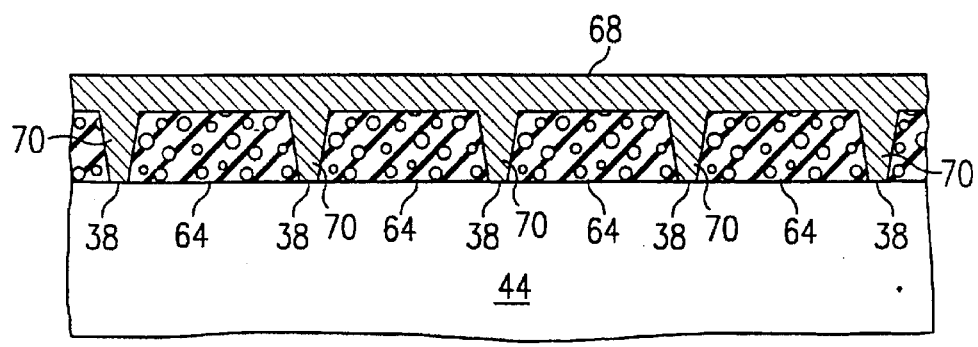
FIG. 5 shows the structure after a metal layer has been deposited over the porous film.
Figure 6:
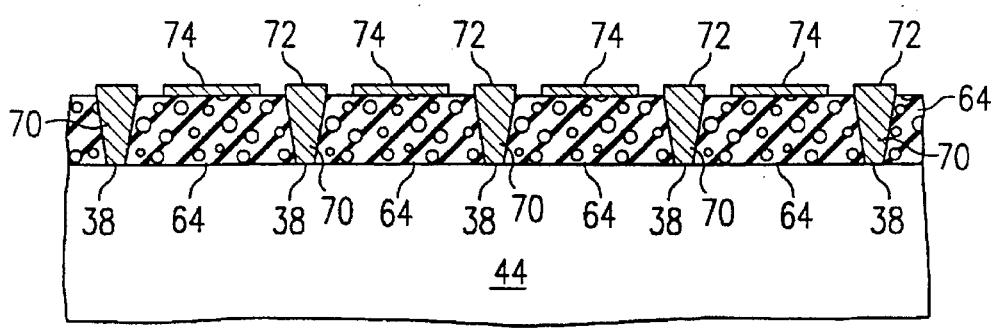
FIG. 6 shows a first embodiment of the structure after the metal layer has been patterned to form vias, arms and contact pads.
Figure 7:
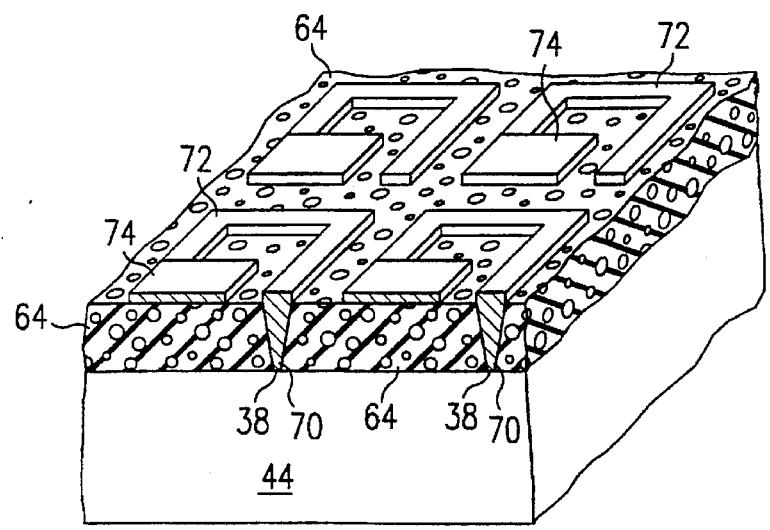
FIG. 7 shows an isometric view of the structure shown in FIG. 6.
Figure 8:
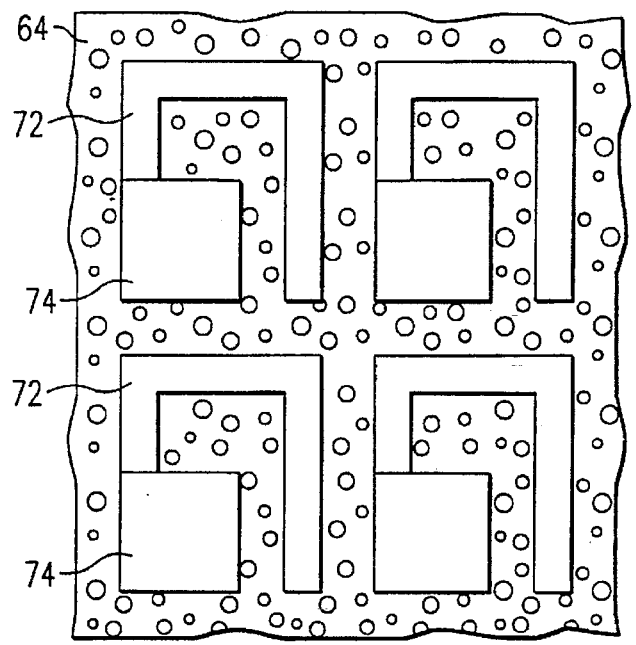
FIG. 8 shows a top view of the structure shown in FIG. 6.

The porous film 64 is patterned and etched to form holes 66 which contact integrated circuit vias 38 of integrated circuitry 44 as shown in FIG. 4. A metal layer 68 is deposited, as shown in FIG. 5, and comprises, for example, a TiW alloy deposited by sputtering or chemical vapor deposition (CVD). The holes 66 are fried with metal layer 68 to form vias 70. The metal layer 68 may then be patterned and etched to selectively remove portions of the metal layer 68 and form arms 72 and contact pads 74 as shown in FIG. 6. An isometric view of the structure is shown in FIG. 7, and a top view is shown in FIG. 8.

Figure 9:
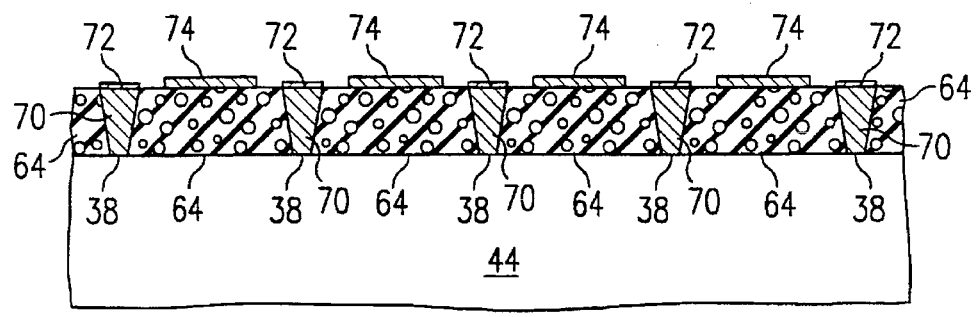
FIG. 9 shows a second embodiment of the structure, with the vias, arms and contact pads formed from metal layers that have been deposited and patterned in separate steps.
Figure 10:
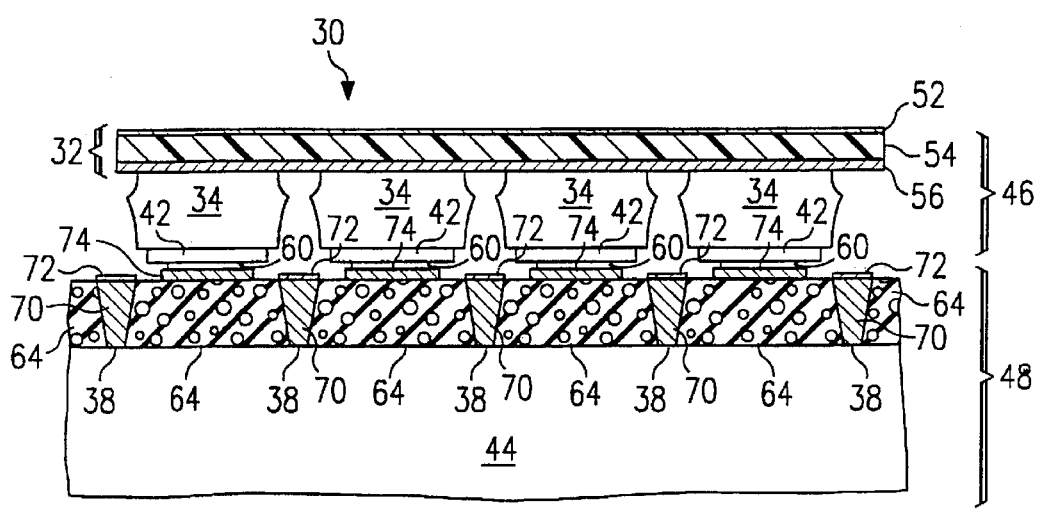
FIG. 10 shows a cross section of the second embodiment of the present invention, after the infrared sensing array has been attached to the sensing integrated circuit structure to form the hybrid structure.

A second embodiment of the present invention is shown in FIGS. 9 and 10. More than one metal layer may need to be deposited in order to form the desired thicknesses of the arms 72 and the contact pads 74. For example, all of the first metal layer 68 may be removed from the top of the porous film 64, leaving metal only in the vias 70. Then a second metal layer may be deposited, patterned and etched to leave the arms 72. Then a third metal layer may be deposited, patterned and etched to form the contact pads 74. Preferably, the arm 72 geometry is chosen to minimize thermal conductivity through the electrical conduction path, as shown in FIG. 9. Also, although the contact pads 74 are wet by the bonding material 60, the arms are preferably not. To accomplish this, it may be desirable to form the contact pads 74 from a different metal than the arms 72.

An electrical conduction path is formed from the contact pads 74 to the arms 72 to the vias 70 to the integrated circuit vias 38 of the integrated circuitry 44. This conduction path performs the function of the interconnect metal 40 of the prior art. The difficult lithography process of the interconnect metal of prior art is eliminated and replaced by one or more planar metal deposition, pattern and etch steps which are easier to perform.

The infrared sensing array 46 is then bonded to the sensing integrated circuit structure 48 with the use of a bonding material 60 applied between the infrared pixel electrical contact 42 and the contact pad 74, as illustrated in FIG. 10, to form the completed hybrid structure 30. The porous film 64 has a high thermal resistance and performs the function of a backfill material between the integrated circuitry 44 and the pixels 34.

Figure 11:
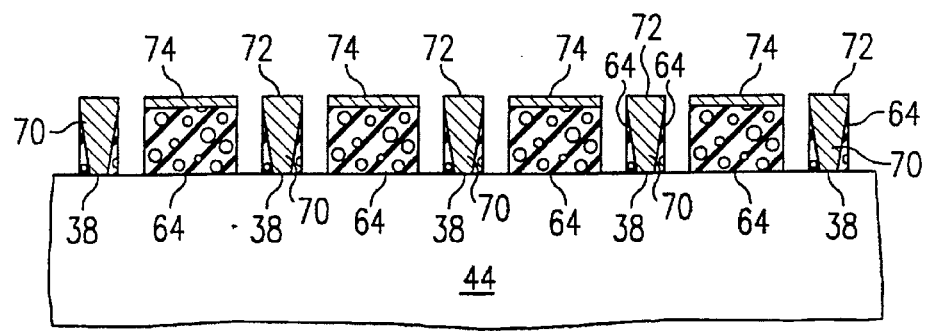
FIG. 11 shows a third embodiment of the structure shown in FIG. 6, where the porous film has been removed from areas where metal is not present.
Figure 12:
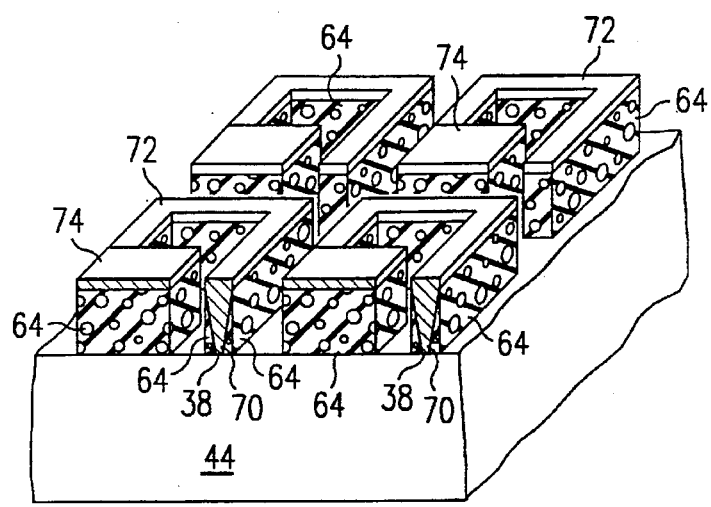
FIG. 12 shows an isometric view of the structure shown in FIG. 11.
Figure 13:
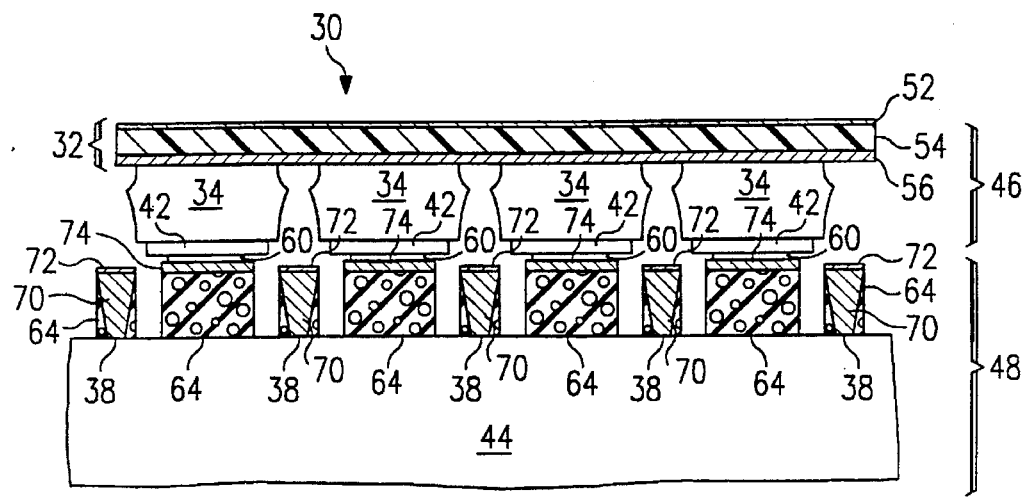
FIG. 13 shows a cross section of the third embodiment of the present invention, after the infrared sensing array has been attached to the sensing integrated circuit structure to complete the hybrid structure.

A third embodiment is depicted in FIGS. 11–13. In this embodiment, the porous film 64 is etched away where metal does not reside, as shown in FIG. 11. The porous film 64 may be etched, for example, with a dry etch, leaving the porous film 64 remaining beneath contact pads 74 and arms 72, and possibly along the sidewalls of the vias 70, as shown in an isometric view in FIG. 12. The contact pads 74 and the arms 72 may act as a mask for this etching step. The infrared sensing array 46 is then bonded to the sensing integrated circuit structure 48 as described for prior embodiments, as illustrated in FIG. 10, to form the completed hybrid structure 30.

Figure 14:
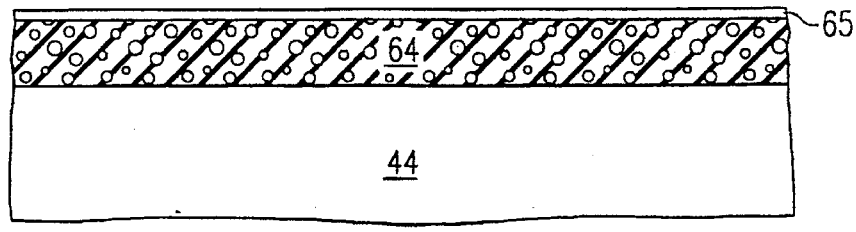
FIG. 14 shows a fourth embodiment, after a protective film has been deposited over the porous film of the structure shown in FIG. 3.
Figure 15:
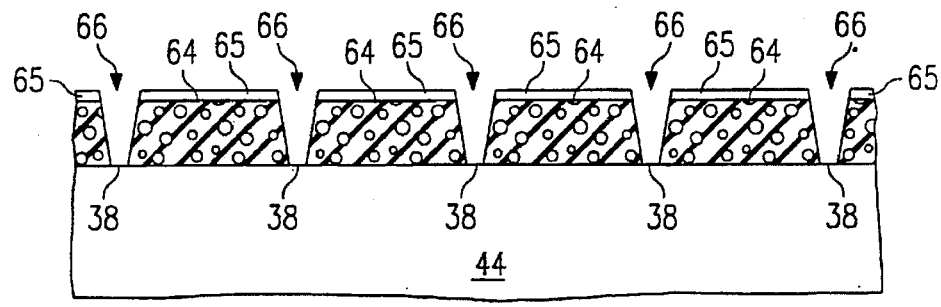
FIG. 15 illustrates the structure of FIG. 14 after the protective film and porous film have been patterned and etched to form holes.
Figure 16:
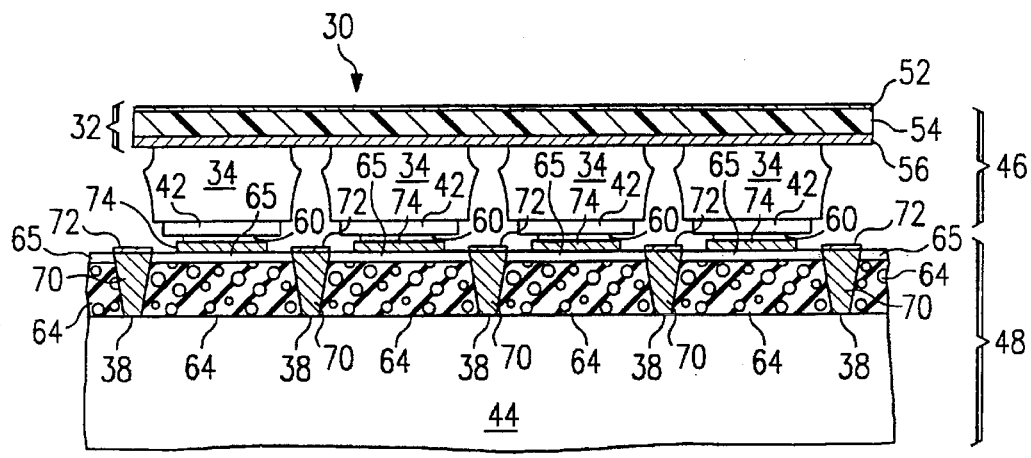
FIG. 16 shows a cross section of the fourth embodiment of the present invention, after the infrared sensing array has been attached to the sensing integrated circuit structure to form the hybrid structure.

A fourth embodiment of the present invention is shown in FIGS. 14–16. After the precursor film 62 is gelled as shown in FIG. 3, a protective film 65 may be deposited over the porous film 64 as shown in FIG. 14. The protective film 65 is preferably silicon dioxide that is sputtered on at room temperature, but it may also be deposited by chemical vapor deposition (CVD). The protective film 65 may also comprise other silicon composites, or conventional oxides or nitrides. The protective film 65 and the porous film 64 are then patterned and etched to form holes 66 which contact integrated circuit vias 38 of integrated circuitry 44 as shown in FIG. 15. Vias 70 are formed in the holes 66, and arms 72 and contact pads 74 are formed on the protective film 65 as described for previous embodiments. The infrared sensing array 46 is then bonded to the sensing integrated circuit structure 48 as previously described to form the completed hybrid structure shown in FIG. 16. The protective film 65 provides more mechanical support for the metal deposited upon it (the arms 72 and contact pads 74. The protective film 65 also prevents the metal from penetrating into the xerogel, decreasing thermoconductivity. The protective film 65 creates a more planar surface than the porous film 64, which improves the photolithography. The protective film also seals the porous film surface, minimizing outgassing in low pressure applications.

Figure 17:
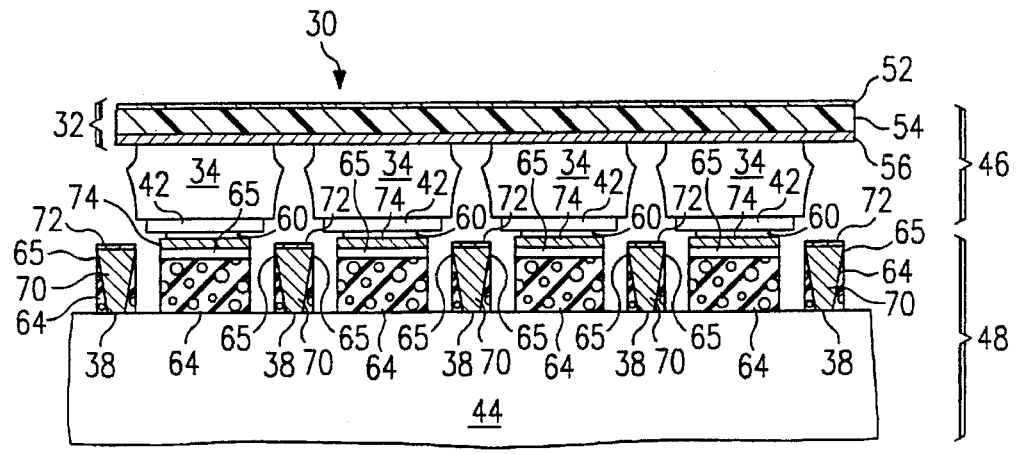
FIG. 17 shows a cross section of the hybrid structure combining the third and fourth embodiments.

The embodiments described can be combined in many ways. For example, the third and fourth embodiments can be combined as shown in FIG. 17, where a protective film 65 is deposited over porous film 64, and then the porous film 64 and protective film 65 are etched away where metal is not present.

There are many alternates to the hybrid structure illustrated. For example, although the optical coating 32 is represented as a planar surface, this coating may contain elevations or corrugations for better thermal isolation as has been shown in the references. The porous layer may comprise other suitable aerogels or xerogels. The porous film may be covered with the protective film on all surfaces, rather than just the top surface as in FIG. 15.

The novel invention of thermal isolation mesas manufactured from a porous film has many advantages over prior art thermal isolation mesas. First, the lithography process, or patterning, of the interconnect metal 40 which provides the electrical connection between the pixels 34 and the integrated circuitry 44 is eliminated and replaced with one or more simple metal deposition, patterning and etching steps. Second, the temperatures required to process the porous film 64 typically are below 100° C., which prevents or minimizes damage to the underlying integrated circuitry 44. Third, thermal isolation between the pixels 34 and the integrated circuitry 44 is improved because silica aerogels are better thermal insulators than organic materials. The improved thermal isolation maintains the thermal time constant as detector mass is reduced, and may permit the use of thinner pixels. The optimal thermal time constant for a given detector geometry may be realized by controlling the arm metal geometry (metal thickness) for a given metallization. In the future, thinner pixels may be utilized for hybrid infrared detectors. The use of the porous film of this invention for the formation of the thermal isolation mesas provides increased thermal isolation and allows use of thinner pixels (although the interconnect metal material may need to be changed to a metal having a lower thermal resistance). Also, the protective film 65 provides more mechanical support for the metal deposited upon it (the arms 72 and contact pads 74. The protective film 65 prevents the metal from penetrating into the xerogel, decreasing thermoconductivity. The protective film 65 creates a more planar surface than the porous film 64, which improves the photolithography. The protective film also seals the porous film surface, minimizing outgassing in low pressure applications.

While the invention has been described with reference to illustrative embodiments, this description is not intended to be construed in a limiting sense. Various modifications and combinations of the illustrative embodiments, as well as other embodiments of the inventions, will be apparent of persons skilled in the art upon reference to the description. It is therefore intended that the appended claims encompass any such modifications or embodiments.

What is claimed is:

1. A hybrid thermal detector structure, comprising:

an infrared sensing array comprising at least three thermally sensitive pixels, electrical contacts abutting one side of said pixels, and an optical coating in contact with an opposite side of said pixels; and a sensing integrated circuit structure comprised of integrated circuitry, a porous film deposited on said integrated circuitry, and contact pads electrically connected to said integrated circuitry through said porous film;

wherein said electrical contacts of said infrared sensing array are coupled to said contact pads of said sensing integrated circuit structure.

2. The structure of claim 1 wherein said porous material is a xerogel.

3. The structure of claim 2 wherein said xerogel comprises silicon dioxide.

4. The structure of claim 1 wherein said porous material is an aerogel.

5. The structure of claim 4 wherein said aerogel comprises silicon dioxide.

6. The structure of claim 1 wherein said porous film has a porosity of greater than 80%.

7. The structure of claim 1 wherein said sensing circuit further comprises a protective film deposited on said porous film.

* * * * *